(12) United States Patent
Son et al.

(10) Patent No.: US 8,945,992 B2
(45) Date of Patent: Feb. 3, 2015

(54) POWER DEVICE PACKAGE COMPRISING METAL TAB DIE ATTACH PADDLE (DAP) AND METHOD OF FABRICATING THE PACKAGE

(75) Inventors: Joon-seo Son, Seoul (KR); O-seob Jeon, Seoul (KR); Taek-keun Lee, Bucheon-si (KR); Byoung-ok Lee, Bucheon-si (KR)

(73) Assignee: Fairchild Korea Semiconductor, Ltd., Bucheon-si (KR)

( * ) Notice: Subject to any disclaimer, the term of this patent is extended or adjusted under 35 U.S.C. 154(b) by 630 days.

(21) Appl. No.: 13/278,664

(22) Filed: Oct. 21, 2011

(65) Prior Publication Data

US 2012/0034741 A1 Feb. 9, 2012

Related U.S. Application Data

(62) Division of application No. 11/970,911, filed on Jan. 8, 2008, now Pat. No. 8,067,826.

(30) Foreign Application Priority Data

Jan. 8, 2007 (KR) .................. 10-2007-0002184

(51) Int. Cl.
*H01L 21/00* (2006.01)
*H01L 23/495* (2006.01)
*H01L 23/00* (2006.01)

(52) U.S. Cl.
CPC . *H01L 23/49562* (2013.01); *H01L 2224/48247* (2013.01); *H01L 24/48* (2013.01); *H01L 2224/32245* (2013.01); *H01L 2224/73265* (2013.01)

USPC .... 438/123; 438/121; 438/127; 257/E21.502; 257/667; 257/676

(58) Field of Classification Search
CPC .......... H01L 2224/48091; H01L 2224/48247; H01L 2924/01079
USPC .......... 257/E21.502, 667–669, 691, 698, 676, 257/780, 787; 438/119, 118, 121–124, 127, 438/197; 361/734
See application file for complete search history.

(56) References Cited

U.S. PATENT DOCUMENTS

| | | | |
|---|---|---|---|
| 5,172,213 A * | 12/1992 | Zimmerman | 257/796 |
| 5,804,468 A | 9/1998 | Tsuji et al. | |
| 5,939,214 A | 8/1999 | Mahulikar et al. | |
| 6,031,279 A * | 2/2000 | Lenz | 257/686 |
| 6,056,186 A | 5/2000 | Dickson et al. | |

(Continued)

FOREIGN PATENT DOCUMENTS

| | | |
|---|---|---|
| JP | 1997232341 A | 5/1997 |
| JP | 2006032888 A | 2/2005 |

*Primary Examiner* — Chris Chu
(74) *Attorney, Agent, or Firm* — Christensen O'Connor Johnson Kindness PLLC

(57) ABSTRACT

A metal tab die attach paddle (DAP) disposed between the lead frame and a power device die in a power device package reduces the stress exerted on the semiconductor power device die caused by the different coefficients of thermal expansion (CTE) of the semiconductor power device die and the lead frame. In addition the power device package substantially prevents impurities from penetrating into the power device package by increasing the surface creepage distance of a sealant resulting from the metal tab DAP and an optional swaging of the lead frame.

9 Claims, 5 Drawing Sheets

(56) References Cited

U.S. PATENT DOCUMENTS

| | | |
|---|---|---|
| 6,144,108 A | 11/2000 | Ohizumi et al. |
| 6,257,215 B1 | 7/2001 | Kaminaga et al. |
| 6,373,127 B1 | 4/2002 | Baudouin et al. |
| 6,376,905 B2 | 4/2002 | Hisano et al. |
| 6,395,391 B1 | 5/2002 | Oka et al. |
| 6,608,375 B2 | 8/2003 | Terui et al. |
| 6,613,829 B2 | 9/2003 | Fukuizumi et al. |
| 6,690,087 B2 * | 2/2004 | Kobayashi et al. ........... 257/686 |
| 6,756,658 B1 | 6/2004 | Gillett et al. |
| 6,774,466 B1 * | 8/2004 | Kajiwara et al. .............. 257/673 |
| 6,781,219 B2 | 8/2004 | Bissey |
| 6,933,594 B2 | 8/2005 | McLellan et al. |
| 7,294,912 B2 * | 11/2007 | Takeuchi et al. .............. 257/675 |
| 7,528,489 B2 | 5/2009 | Kajiwara et al. |
| 7,541,672 B2 | 6/2009 | Satou et al. |
| 7,579,677 B2 * | 8/2009 | Ikeda et al. ................... 257/676 |
| 8,536,690 B2 * | 9/2013 | Camacho et al. .............. 257/676 |
| 2006/0151889 A1 * | 7/2006 | Kajiwara et al. .............. 257/787 |

\* cited by examiner

POWER DEVICE PACKAGE COMPRISING METAL TAB DIE ATTACH PADDLE (DAP) AND METHOD OF FABRICATING THE PACKAGE

CROSS-REFERENCE TO RELATED PATENT APPLICATION

This application is a divisional of U.S. patent application Ser. No. 11/970,911 filed Jan. 8, 2008, which claims the benefit of Korean Patent Application No. 10-2007-0002184, filed on Jan. 8, 2007, in the Korean Intellectual Property Office, the specification of which is hereby incorporated in its entirety by reference.

BACKGROUND OF THE INVENTION

1. Field of the Invention

The present invention relates to power device packages and methods of fabricating the power device packages, and more particularly, to power device packages which reduce the stress exerted on a power device die and a method of fabricating the power device packages.

2. Description of the Related Art

One type of conventional power device package has at least one semiconductor power device bonded directly to a lead frame and sealed with an molding resin such as an epoxy molding compound (EMC).

However, when the semiconductor die is directly bonded to the lead frame as in this type of conventional power device package, the semiconductor die is stressed by a temperature change since the coefficient of thermal expansion (CTE) of a semiconductor die is substantially different from that of a lead frame on which the semiconductor die is bonded. As such, the semiconductor die is deformed by the stress, and the performance of the semiconductor die usually deteriorates. Moreover, the stress exerted on the semiconductor die results in an inferior and deformed power device package. In addition, the deformed power device packages can crack and foreign substances such as water can penetrate into the power device package through the cracks.

FIG. 1 is a cross-sectional view illustrating a conventional power device package.

Referring to FIG. 1, a silicon power device die 30 is bonded to a lead frame 10 using a conductive adhesive material 20, and the lead frame 10 and the silicon power device die 30 are sealed with a sealant 40 such as an EMC. Conventionally, the lead frame 10 is formed of copper (Cu), and the CTE of the copper is 17 ppm/° C. However, the CTE of the silicon power device die 30 is 2-3 ppm/° C.

If the temperature of the conventional power device package increases due to heat generated during operation of the conventional power device package or applied to the conventional power device package from an outside heat source, the power device die 30 is stressed. The lead frame 10 expands more than the semiconductor die 30 and, as a result, the semiconductor die 30 can be deformed (strained).

In the conventional power device package illustrated in FIG. 1, the sealant 40 has a short surface creepage distance from the outside of the conventional power device package to the silicon power device die 30. Therefore, the sealant 40 can easily crack off from the lead frame 10 and the silicon power device die 30 due to the difference in the CTEs of the silicon power device die 30 and the lead frame 10. Foreign substances such as water can penetrate into the silicon power device die 30 through the cracks resulting in defective power device packages.

In addition, since the conventional power device package has the silicon power device die 30 directly bonded to the lead frame 10, the size of the silicon power device die 30 is limited to the size of the lead frame 10.

SUMMARY OF THE INVENTION

The present invention provides a power device package and a method of fabricating the power device package which reduces stress exerted on a semiconductor die, in which the stress is caused by the difference between a coefficient of thermal expansion (CTE) of the semiconductor die and that of a lead frame.

According to an aspect of the present invention, there is provided a power device package including a lead frame, a metal tab die attach paddle (DAP) attached to the lead frame, and a power device die bonded to the metal tab DAP.

The metal tab DAP may be attached to the lead frame using a first conductive adhesive material, the power device die may be bonded to the metal tab DAP using a second conductive adhesive material, and a melting point of the first conductive adhesive material may be higher than that of the second conductive adhesive material. The metal tab DAP may include a plated portion in order to improve the wettability of the metal tab DAP for the first and second conductive adhesive materials, and the first and second conductive adhesive materials may be attached to the plated portion. The first and second conductive adhesive materials may be formed of a solder wire or solder paste.

The metal tab DAP may have a CTE lower than that of the lead frame. The metal tab DAP may have a CTE to compensate for a difference between a CTE of the lead frame and a CTE of the power device die so as to minimize a stress exerted on the power device die. The metal tab DAP may have an area larger than that of the lead frame so as to allow a larger power device die to be bonded to the metal tab DAP.

The package may further include a sealant surrounding the lead frame, the metal tab DAP, and the power device die so as to seal the power device die, the sealant having a long surface creepage distance from an outside of the package to the power device die due to the metal tab DAP.

The lead frame may be formed of Cu, and the metal tab DAP may be formed of an alloy of Fe and Ni having a CTE lower than that of Cu, wherein the metal tab DAP may be attached to the lead frame using a first conductive adhesive material, the power device die may be bonded to the metal tab DAP using a second conductive adhesive material, and a melting point of the first conductive adhesive material is higher than that of the second conductive adhesive material.

The metal tab DAP may include a Cu-plated portion and a Ag-plated portion in order to improve the wettability of the metal tab DAP for the first and second conductive adhesive materials, the first conductive adhesive material may be attached to the Cu plated portion, and the second conductive adhesive material may be attached to the Ag plated portion. The metal tab DAP may have a CTE lower than that of the lead frame. The metal tab DAP may have an area larger than that of the lead frame.

The lead frame may be a single gauged lead frame having the same thickness as an outside lead or a dual gauged lead frame having a different thickness than the outside lead. The power device package may be a surface mount device type package.

According to another aspect of the present invention, there is provided a method of fabricating a power device package, the method including forming a metal tab DAP on a lead frame, forming a power device die on the metal tab DAP, and surrounding the lead frame, the metal tab DAP, and the power device die with a sealant so as to seal the power device die.

The metal tab DAP may be attached to the lead frame using a first conductive adhesive material, and the power device die may be bonded to the metal tab DAP using a second conductive adhesive material, a melting point of the first conductive adhesive material is higher than that of the second conductive adhesive material.

The metal tab DAP may include a plated portion so as to improve the wettability of the metal tab DAP for the first and second conductive adhesive materials, and the first and second conductive adhesive materials may be attached to the plated portion. The metal tab DAP may have a CTE to compensate for a difference between a CTE of the lead frame and a CTE of the power device die so as to minimize a stress exerted on the power device die.

The metal tab DAP may have an area larger than that of the lead frame so as to allow a larger power device die to be formed on the metal tab DAP. The sealant may include a long surface creepage distance from an outside of the package to the power device die due to the metal tab DAP.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Figure 1:
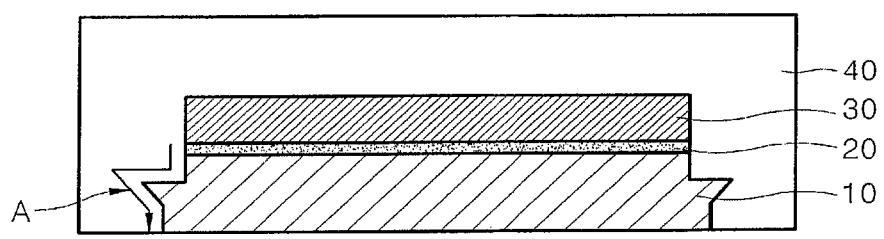
FIG. 1 is a cross-sectional view of a conventional power device package.

The present invention will now be described more fully with reference to the accompanying drawings according to embodiments of the present invention. In the drawings, the thicknesses of layers and regions are in some cases distorted for clarity.

Figure 2A:
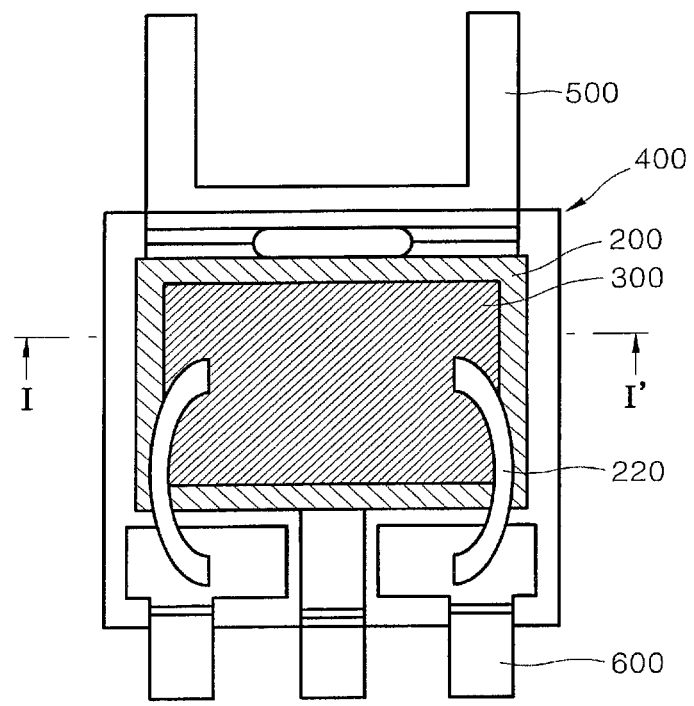
FIG. 2A is a plan view of a power device package including a metal tab die attach paddle (DAP), according to an embodiment of the present invention.

FIG. 2A is a plan view of a power device package including a metal tab die attach paddle (DAP) 200, according to an embodiment of the present invention.

Referring to FIG. 2A, the power device package includes a lead frame 100 (shown in FIG. 2B), a metal tab die attach paddle (DAP) 200 attached to the lead frame 100, a power device die 300 bonded to the metal tab DAP 200, and a sealant 400 (shown in outline) sealing the metal tab DAP 200 and the power device die 300, to which an outside lead 600 is electrically connected to the power device die 300 through bonding wires 220. A tie bar 500 formed at an upper portion of the power device package is used in the package forming process and is removed at the end of the process.

The power device package according to an embodiment of the present invention includes the power device die 300 bonded to the metal tab DAP 200, hence, the power device die 300 is not directly bonded to the lead frame 100. The metal tab DAP 200 is attached to the lead frame 100 to reduce stress exerted on the power device die 300 due to stress caused by the difference between the coefficient of thermal expansion (CTE) of the power device die 300 and the lead frame 100. The power device package according to an embodiment of the present invention will now be described more fully with reference to FIG. 2B.

Figure 2B:
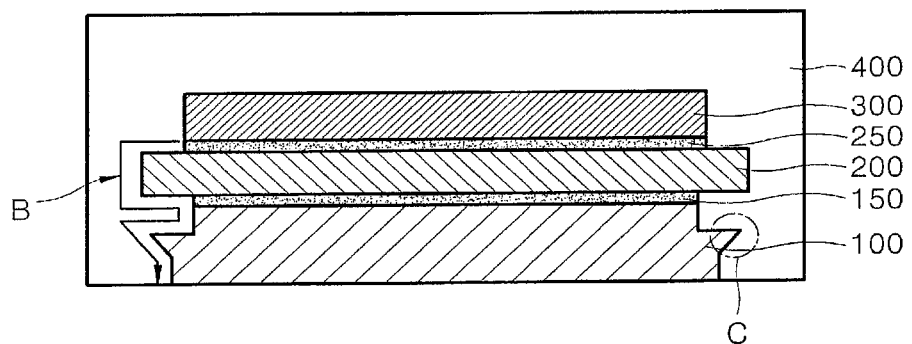
FIG. 2B is a cross-sectional view taken along line □-□' of FIG. 2A.

Referring to FIG. 2B, the metal tab DAP 200 is attached to the lead frame 100, the power device die 300 is bonded to the metal tab DAP 200, and a sealant 400 seals the power device die 300.

The metal tab DAP 200 is attached to the lead frame 100 using a first conductive adhesive material 150, and the power device die 300 is die bonded to the metal tab DAP 200 using a second conductive adhesive material 250. The metal tab DAP 200 may be formed of a material which reduces the stress exerted on the power device die 300. For example, in case of a conventional lead frame formed of copper, the metal tab DAP 200 may be formed of an alloy of iron (Fe) and nickel (Ni). The CTE of the alloy is between that of the lead frame 100 and that of the power device die 300. Hence, the metal tab DAP 200 may have a CTE that reduces the stress caused by the difference in thermal expansion between the lead frame 100 and the power device die 300. The thickness of the metal tab DAP 200 may appropriately be formed by considering stress reduction and the thickness of the whole power device package. For example, the thickness of the metal tab DAP 200 may be 0.20-0.50 μm.

During the packaging process, the metal tab DAP 200 is attached to the lead frame 100, and then, the power device die 300 is die bonded to the metal tab DAP 200. Therefore, the melting point of the first conductive adhesive material 150 may be higher than that of the second conductive adhesive material 250. The first conductive adhesive material 150 attaches the metal tab DAP 200 to the lead frame 100. The second conductive adhesive material 250 bonds the power device die 300 to the metal tab DAP 200. The first and second conductive adhesive materials 150 and 250 may be solder wire or solder paste. The first and second conductive adhesive materials 150 and 250 may be formed of a solder which is an alloy of Pb, Sn, and Ag. The first and second conductive adhesive materials 150 and 250 may have an appropriate thickness to insure a firm bond within the constraints of the thickness of the whole package. The thickness of the first and second conductive adhesive materials 150 and 250 may be about 0.5-3 mm.

The metal tab DAP 200 should have an efficient wettability for the first and second conductive adhesive materials 150 and 250. The efficient wettability makes it possible for the metal tab DAP 200 to be firmly attached to the lead frame 100 and for the power device die 300 to be firmly bonded to the metal tab DAP 200. In order to improve the wettability of the metal tab DAP 200, a portion of the metal tab DAP 200 may be plated such that the portion contacts the first and second conductive adhesive materials 150 and 250. For example, a portion of the metal tab DAP 200 is plated with Cu, which contacts the first conductive adhesive material 150, and a portion is plated with Ag, which contacts the second conductive adhesive material 250.

For a conventional power device package, the bonding force of the sealant 400 and surface creepage distance of the sealant 400 are increased by a swaging C to the lead frame 100, so that impurities are substantially prevented from penetrating into the power device die 300. However, increasing the surface creepage distance of the sealant 400 is limited since the power device die 300 is directly bonded to the lead frame 100.

The power device package according to an embodiment of the present invention includes the metal tab DAP 200 attached to the lead frame 100 and the power device die 300 bonded to the metal tab DAP 200, so that the bonding force of the sealant 400 is increased by an extended bonding area of the sealant 400 resulting from the DAP 200 and the swaging C. In addition, impurities are more effectively prevented from penetrating into the power device die 300 through a surface creepage B since the surface creepage B distance of the sealant 400 is increased from the outside of the package to the power device die 300 as compared with that of the conventional power device package illustrated in FIG. 1.

Figure 3:
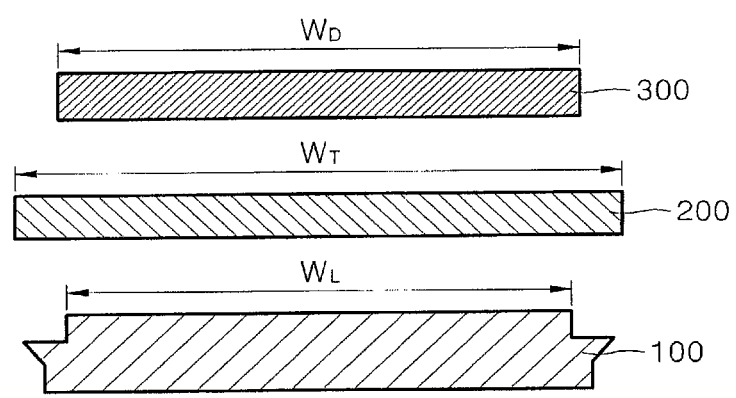
FIG. 3 is an exploded sectional view of select elements illustrated in FIG. 2B.

FIG. 3 is an exploded sectional view illustrating the relative widths of the power device die 300, the metal tab DAP 200, and the lead frame 100 of the power device package illustrated in FIG. 2B.

Referring to FIG. 3, the relative widths $W_L$, $W_T$, and $W_D$ of the lead frame 100, the metal tab DAP 200, and the power device die 300 are illustrated, respectively. For a conventional power device package, the size of the power device die 300 is limited according to the size of the lead frame 100 bonded to the power device die 300.

However, the power device package according to an embodiment of the present invention includes the metal tab DAP 200 attached to the lead frame 100, and the power device die 300 bonded to the metal tab DAP 200. Therefore, the size of the power device die 300 can be accommodated by controlling the size of the metal tab DAP 200 attached to the lead frame 100. Hence, the width of the power device die 300 can be greater than that of the lead frame 100. Even though only the widths are illustrated in FIG. 3, the lengths of the power device die 300, the metal tab DAP 200, and the lead frame 100 have the same relative sizes as the widths illustrated in FIG. 3. Therefore, the whole area of the surface of the metal tab DAP 200 bonded to the power device 300 can be controlled by selecting the width $W_T$ of the metal tab DAP 200 and the length of the metal tab DAP 200 so that the whole area is optimized for each type of power device die 300.

An effect of adding the metal tab DAP 200 will now be described with reference to the accompanying simulation data, in which the effect of adding the metal tab DAP 200 is simulated by adding the metal tab DAP 200 to a power device package according to an embodiment of the present invention.

Table 1 shows the stress simulation data. The size of the chip used in the simulation is 3580×2800×300 μm³, and the size of the metal tab DAP is 5.4×4.0×0.5 mm³. The thicknesses of first and second conductive adhesives are 50 μm and 30 μm, respectively, and are formed of an alloy of Pb, Sn, and Ag. For the simulation, it is assumed that the power device package has a uniform temperature dispersion, a non-separation of an epoxy molding compound (EMC) of the sealant and a lead frame, and a non-separation of the EMC of the sealant and the chip. In addition it is assumed that there are no voids in the solder, no water absorption, a uniform thickness of each bonding layer, and normal sawing characteristics.

TABLE 1

| | Current Model Package | | | Adding part - Copper | | | Adding part - Alloy | | |
|---|---|---|---|---|---|---|---|---|---|
| | | Solder | | | Solder | | | Solder | |
| | Chip Principal stress | Mises Stress (MPa) | Plastic Strain (%) | Chip Principal stress | Mises Stress (MPa) | Plastic Strain (%) | Chip Principal stress | Mises Stress (MPa) | Plastic Strain (%) |
| 175° C.->25° C. | 26.4 | 47.4 | 1.0 | 27.3 | 47.8 | 1.03 | 6.4 | 40.0 | 0.4 |
| 25° C.->260° C. | 225.5 | 105.4 | 5.64 | | | | 185.0 | 60.3 | 2.03 |

In Table 1, the "Current Model Package" column is a conventional power device package with a chip directly bonded to a conventional lead frame, the "Adding part—Copper" column is a power device package including a metal tab DAP formed of Cu, and the "Adding part—Alloy" column is a power device package including a metal tab DAP formed of an alloy of Fe and Ni. The temperature conditions include a temperature variation from a molding temperature of 175° C. to a room temperature of 25° C. and another temperature variation from a room temperature of 25° C. to a high operating temperature of 260° C.

Table 1 illustrates that the stress exerted on a die of the metal tab DAP formed of alloy is remarkably lower than that of the current model package. The solder is an adhesive material applied on a portion of the metal tab DAP on which the die is formed. The stress and the strain exerted on the solder of the metal tab DAP formed of alloy are also remarkably lower than those of the current model package. However, the metal tab DAP formed of Cu is not significantly different from the current model package of a power device package since the current model package also includes a copper layer on which the die is formed.

The stress simulation data illustrates that stress exerted on the chip and the solder can be efficiently reduced by applying an appropriate metal tab DAP to the power device package.

Table 2 illustrates the thermal resistance simulation data.

TABLE 2

| | Rthja (° C./W) | | | | |
|---|---|---|---|---|---|
| | Normal KFC ½H lead | +PMC90 Tab | | +Alloy Tab | |
| | frame | 0.25 mm | 0.38 mm | 0.25 mm | 0.38 mm |
| minimum land pattern | 107.2 | 105.8 | 105.2 | 106.9 | 106.7 |
| 1 in² Cu plane | 38.5 | 38.3 | 38.3 | 39.6 | 40.0 |

In Table 2, the "Normal KFC 1/2H lead frame" column is without a metal tab DAP, the "PMC90 Tab" column is with a metal tab DAP formed of Cu, and the "Alloy Tab" column is with a metal tab DAP formed of alloy of Fe and Ni. In addition, the metal tab DAPs have thicknesses of 0.25 mm and 0.38 mm. Rthja is an abbreviation for Thermal Resistance between Junction to Ambient, in units of ° C./W. The "minimum land pattern" row is without a heat emitting thermal plane, and the "1 in² Cu Plane" row is with a Cu thermal plane. The thermal conductivity of the normal KFC 1/2H lead frame by itself is 364.5 W/m ° C., and the thermal conductivity of the alloy tab by itself is 25.8 W/m ° C.

Referring to Table 2, even if the thermal conductivity of the alloy tab is lower than that of the normal KFC 1/2H lead frame, the Rthja of the power device package including the alloy tab is not significantly different from those of the PMC 90 tab and the normal KFC 1/2H lead frame. Thus, the alloy tab can be applied to the power device package without affecting the Rthja of the power device package.

Figure 4A:
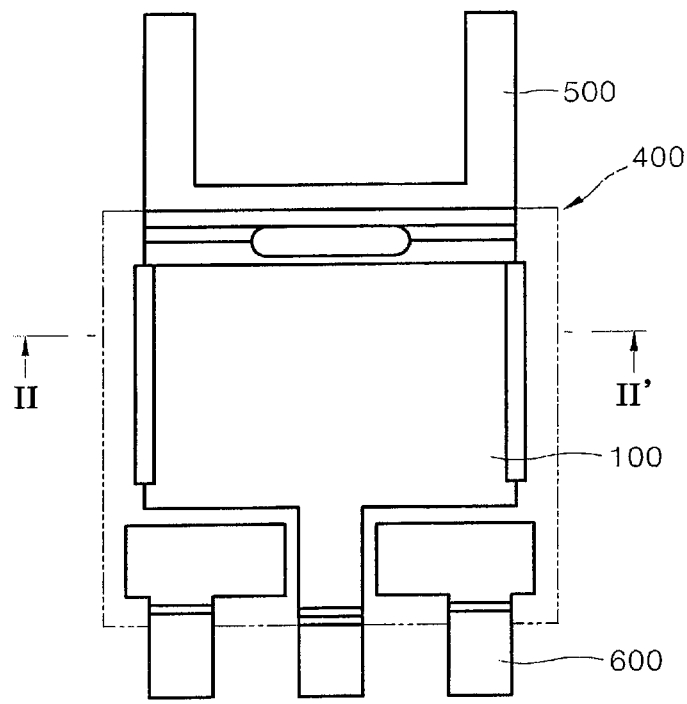
FIGS. 4A, 5A, and 6A are plan views illustrating a method of fabricating a power device package according to an embodiment of the present invention.
Figure 4B:
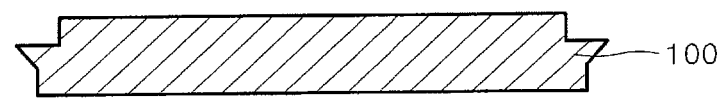
FIGS. 4B, 5B, and 6B are sectional views taken along lines II-II', III-III', and IV-IV' of FIGS. 4A, 5A, and 6A, respectively.
Figure 5A:
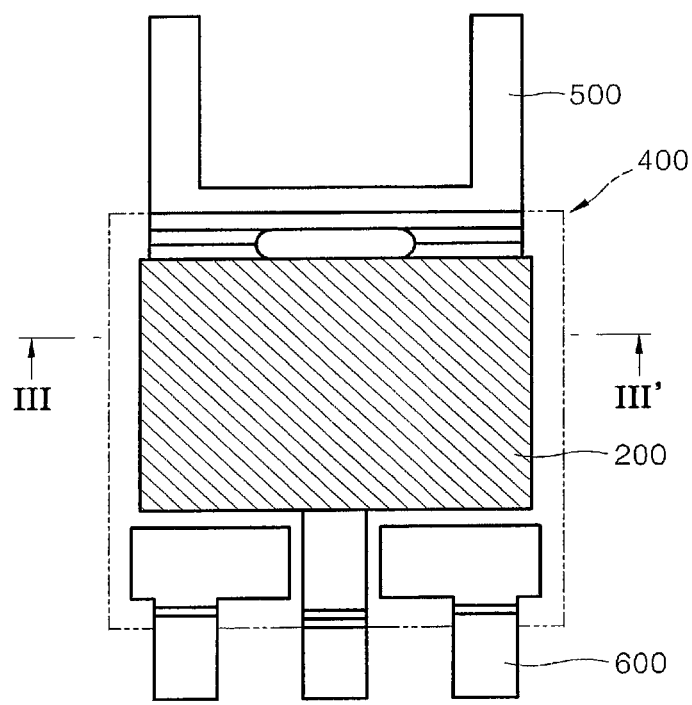
Figure 5B:
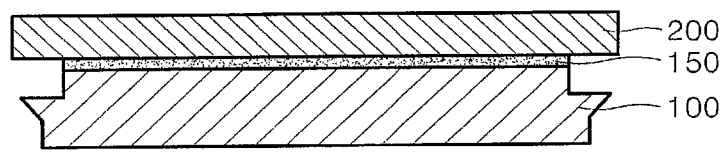
Figure 6A:
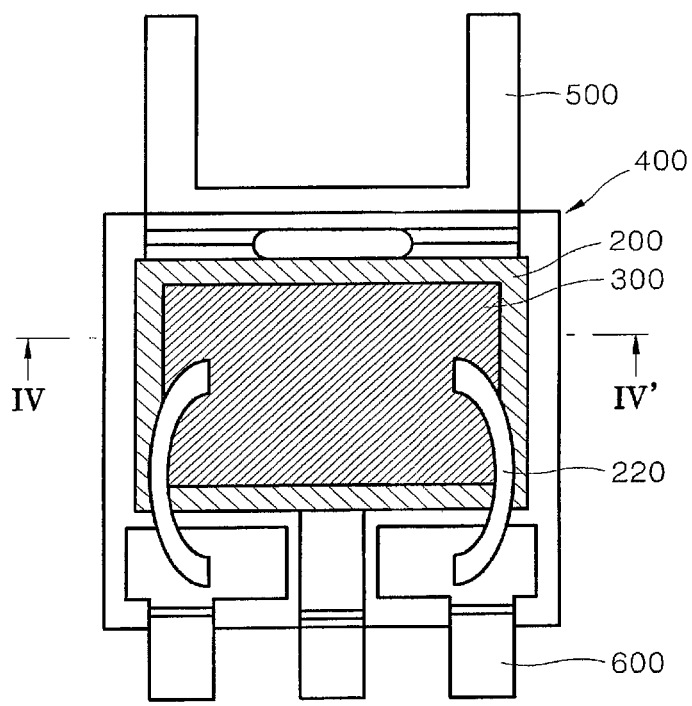
Figure 6B:
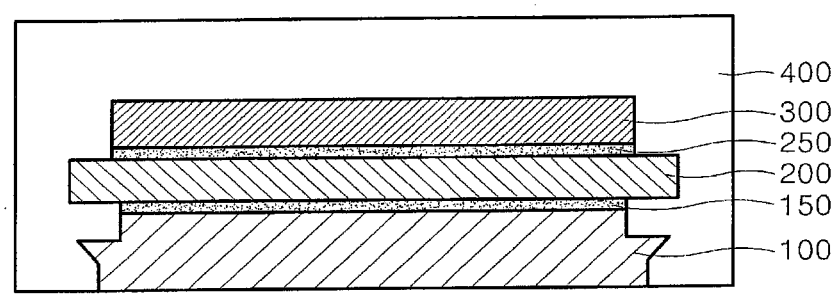

FIGS. 4A, 5A, and 6A are plan views illustrating a method of fabricating a power device package, according to an embodiment of the present invention, and FIGS. 4B, 5B, and 6B are sectional views taken along lines II-II', III-III', and IV-IV' of FIGS. 4A, 5A, and 6A, respectively.

Referring to FIGS. 4A and 4B, the lead frame 100 is prepared, and formed by a swaging process. As described above, the tie bar 500 and the outside lead 600 are connected to the lead frame 100. The phantom-lined box represents a region sealed by the sealant 400.

Referring to FIGS. 5A and 5B, the first conductive adhesive material 150 is disposed on the lead frame 100, and then the metal tab DAP 200 is disposed on the first conductive adhesive material 150. As described above, the first conductive adhesive material 150 may be a solder paste. The bottom of the metal tab DAP 200 contacting the first conductive adhesive material 150 may be plated in order to improve the wettability of the metal tab DAP 200.

Referring to FIGS. 6A and 6B, the second conductive adhesive material 250 is disposed on the metal tab DAP 200, and then the power device die 300 is disposed on the second conductive adhesive material 250. As described above, the melting point of the second conductive adhesive material 250 may be lower than that of the first conductive adhesive material 150. The top surface of the metal tab DAP 200 contacting the second conductive adhesive material 250 may be also plated in order to improve the wettability of the metal tab DAP 200.

After the power device die 300 is die bonded, the power device die 300 is connected to the outside lead 600 through the bonding wires 220, and then, the sealant 400 surrounding the lead frame 100, the metal tab DAP 200, and the power device die 300 is formed to complete the power device package prior to the removal of the tie bar 500.

As described above, the power device package according to an embodiment of the present invention has various advantages since the metal tab DAP is placed between the power device die and the lead frame. With the metal tab DAP the stress exerted on the power device die is reduced, the surface creepage distance of the sealant is increased, and the size of the semiconductor chip in the power device package can be increased.

The power device package according to the present invention significantly reduces the stress exerted on the semiconductor power device die by adding the metal tab DAP between the power device die and the lead frame, in which the stress is caused by the difference between the CTE of the semiconductor power device die and the lead frame.

In addition, the power device package according to the present invention inhibits impurities from penetrating into the power device die since the surface creepage distance of the sealant is increased by adding the metal tab DAP.

Furthermore, the power device package according to the present invention can accommodate various sized power device dies by adjusting the size of the metal tab DAP regardless of the size of the lead frame since the power device die is bonded to the metal tab DAP.

While the present invention has been particularly shown and described with reference to exemplary embodiments thereof, it will be understood by one of ordinary skill in the art that various changes in form and details may be made therein without departing from the spirit and scope of the present invention as defined by the following claims.

The invention claimed is:

1. A method of fabricating a power device package, the method comprising:
   attaching a metal tab die attach paddle to a lead frame, wherein the lead frame comprises a protruding swaging portion and the die attach paddle has a low coefficient of thermal expansion;
   die bonding a power device die to the metal tab die attach paddle; and
   surrounding the lead frame, the metal tab die attach paddle, and the power device die with a sealant so as to seal the power device die.

2. The method of claim 1, wherein the metal tab die attach paddle has an optimal coefficient of thermal expansion (CTE) to compensate for a difference between a CTE of the lead frame and a CTE of the power device die so as to minimize a stress exerted on the power device die.

3. The method of claim 1, wherein the metal tab die attach paddle has an area larger than that of the lead frame so as to allow a larger power device die to be bonded to the metal tab die attach paddle.

4. The method of claim 1, wherein the sealant comprises an increase in the surface creepage distance from an outside of the package to the power device die due to the metal tab die attach paddle.

5. A method of fabricating a power device package, the method comprising:
   attaching a metal tab die attach paddle to a lead frame;
   die bonding a power device die to the metal tab die attach paddle; and
   surrounding the lead frame, the metal tab die attach paddle, and the power device die with a sealant so as to seal the power device die;
   wherein the metal tab die attach paddle is attached to the lead frame using a first conductive adhesive material, the power device die is bonded to the metal tab die attach paddle using a second conductive adhesive material, and a melting point of the first conductive adhesive material is higher than that of the second conductive adhesive material.

6. The method of claim 5, wherein the metal tab die attach paddle comprises a plated portion so as to improve wettability of the metal tab die attach paddle for the first and second conductive adhesive materials, and the first and second conductive adhesive materials are attached to the plated portion.

7. The method of claim 5 wherein the leadframe comprises a protruding swaging portion.

8. A method of fabricating a power device package, the method comprising:
   attaching a metal tab die attach paddle to a lead frame;
   die bonding a power device die to the metal tab die attach paddle; and
   surrounding the lead frame, the metal tab die attach paddle, and the power device die with a sealant so as to seal the power device die;

wherein the lead frame is formed of Cu, and the metal tab die attach paddle is formed of an alloy of Fe and Ni having a coefficient of thermal expansion (CTE) lower than that of Cu, wherein the metal tab die attach paddle is attached to the lead frame using a first conductive adhesive material, the power device die is bonded to the metal tab die attach paddle using a second conductive adhesive material, and a melting point of the first conductive adhesive material is higher than that of the second conductive adhesive material.

9. A method of fabricating a power device package, the method comprising:
attaching a metal tab die attach paddle to a lead frame;
die bonding a power device die to the metal tab die attach paddle; and
surrounding the lead frame, the metal tab die attach paddle, and the power device die with a sealant so as to seal the power device die;
wherein the metal tab die attach paddle has a CTE lower than that of the lead frame and is formed of an alloy of Fe and Ni.

* * * * *